Figure 1:
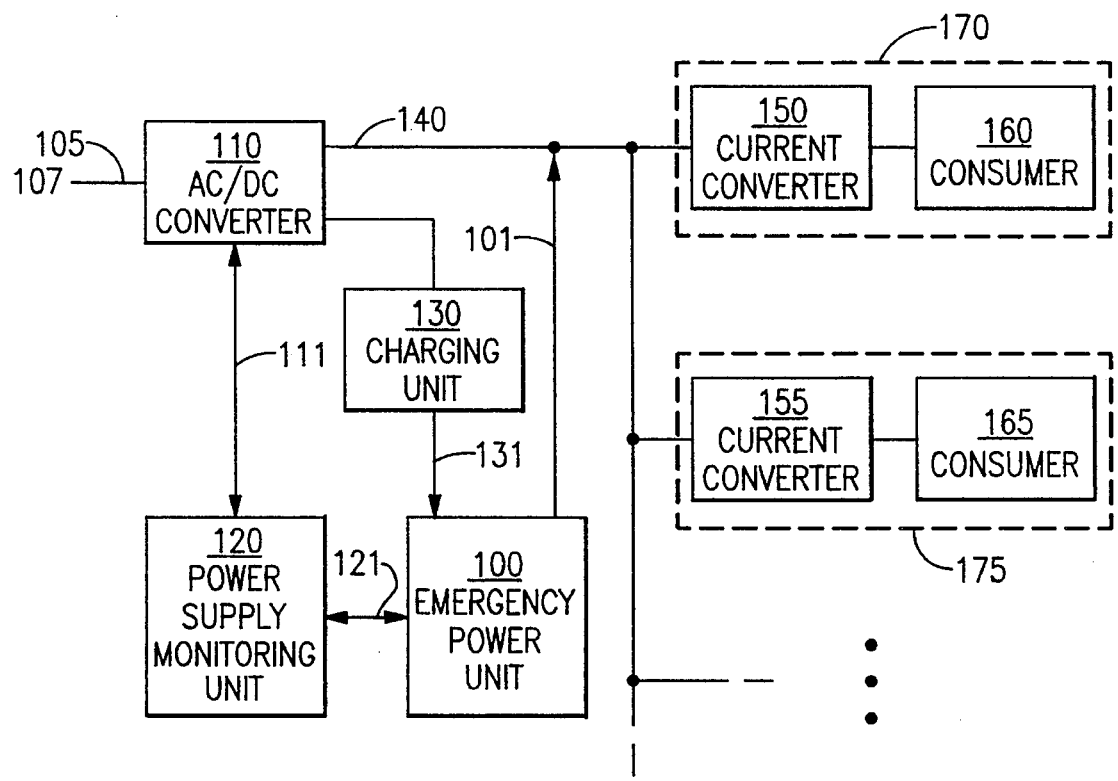

United States Patent [19]
Meyerdirks et al.

[11] Patent Number: 5,552,953
[45] Date of Patent: Sep. 3, 1996

[54] SYSTEM FOR SUPPLYING POWER TO AN APPARATUS AND METHOD FOR THE ASSESSMENT OF THE LIFETIME AND CAPACITY OF A POWER-STORAGE DEVICE

[75] Inventors: Herbert Meyerdirks, Altdorf; Walter Pietschmann, Horb-Bittelbronn, both of Germany

[73] Assignee: International Business Machines Corporation, Armonk, N.Y.

[21] Appl. No.: 373,344

[22] Filed: Jan. 17, 1995

[30] Foreign Application Priority Data

Jan. 29, 1994 [DE] Germany .......................... 44 02 716.8

[51] Int. Cl.⁶ .................................................. H02H 3/00
[52] U.S. Cl. .................. 361/93; 361/90; 361/115
[58] Field of Search .............................. 361/15, 16, 18, 361/24, 93, 90, 115; 320/13; 324/430, 429; 340/636

[56] References Cited

U.S. PATENT DOCUMENTS

| | | | |
|---|---|---|---|
| 4,514,694 | 4/1985 | Finger | 324/429 |
| 5,179,337 | 1/1993 | Staarman et al. | 320/13 |
| 5,250,904 | 10/1993 | Salander et al. | 324/430 |

FOREIGN PATENT DOCUMENTS

| | | | |
|---|---|---|---|
| 0385145 | 9/1990 | European Pat. Off. | H02J 7/04 |
| 3624781 | 2/1987 | Germany | G01R 31/36 |
| 3736481 | 3/1988 | Germany | G01R 31/36 |

*Primary Examiner*—Jeffrey A. Gaffin
*Assistant Examiner*—Stephen Jackson
*Attorney, Agent, or Firm*—Lawrence D. Cutter

[57] ABSTRACT

A system for supplying power to an apparatus (170, 175) with a power-storage device (200) for storing electric power, a first measuring device (310) for measuring a first electrical quantity of the power-storage device (200), a time-determining device (360) for determining the time taken for the first electrical quantity to reach a first level, a second measuring device (320) for measuring a second electrical quantity of the power-storage device (200) and a comparator (330) for comparing the second electrical quantity relative to the determined time with a stored typical time-characteristic of the second electrical quantity. Thereby a method of assessing the lifetime and capacity of the power-storage device (200) is used with as a first step (500) the measurement of a first electrical quantity of the power-storage device (200), as a second step (510) the determination of the time taken for the first electrical quantity to reach a first level, as a third step (520) the measurement of a second electrical quantity of the power-storage device (200), as a fourth step (530) the comparison of the second electrical quantity relative to the determined time with a stored typical time-characteristic of the second electrical quantity and as a fifth step (540) the evaluation of the comparison from the fourth step for an assessment of the lifetime and capacity of the power-storage device (200).

15 Claims, 3 Drawing Sheets

SYSTEM FOR SUPPLYING POWER TO AN APPARATUS AND METHOD FOR THE ASSESSMENT OF THE LIFETIME AND CAPACITY OF A POWER-STORAGE DEVICE

DESCRIPTION

The invention concerns a system for supplying power to an apparatus, with a power-storage device for the storage of electric power, a first measuring means for the measurement of a first electrical quantity of the power-storage device and a time-determining means for the determination of the time taken by the first electrical quantity to reach an initial level. Furthermore the invention concerns a method of assessing the lifetime and capacity of a power-storage device. Its preferred application is in interrupt-free power-supply systems and systems independent of the public power network.

Interrupt-free power-supply systems are today an important requirement for trouble-free operation, particularly of data-processing installations. Short-term and longer-term power failures in the primary power supply are a major problem for data retention and the operation of peripheral equipment. Batteries are often used to cater for these power-supply interruptions, being charged from the public power supply in normal operation and taking over the supply of the system only when it fails.

A critical point for the availability of the batteries in such interrupt-free power-supply systems or in systems independent of the public power network is the condition and lifetime of the power-storage device, particularly as regards establishing whether these need to be replaced.

U.S. Pat. No. 4,716,354 (Hacker) discloses a battery-monitoring system designed to determine remaining battery capacity. This requires the battery data to be constantly measured, stored and calculated, as well as a deep-discharge cycle leading to the more or less total discharge of the batteries. However, in many applications a deep-discharge cycle should be avoided in order not to damage the battery or also in order to be able to have adequate stored power available. Such a deep discharge is also undesirable on energy-saving grounds in emergency power-supply systems which sometimes store significant quantities of power.

U.S. Pat. No. 4,918,368 (Baker et al.) describes a battery-charging system controlled by a microprocessor in which the battery currents are periodically measured and stored while the batteries are being charged or discharged. Battery capacity is calculated from the currents just measured and those previously measured and stored. A disadvantage of this system is that the battery current must be determined periodically, which can be difficult—especially with heavy battery currents.

GE-A 22136000 (Elkoh Giken) discloses a battery-testing circuit which measures the time taken for the battery voltage to change from an initial voltage to a second voltage. The time thus obtained is indicative of battery lifetime. However, the use of this invention is conditional on the battery load current being constant if the estimate of battery lifetime is to be meaningful. The theory of this paper forms the heading of the principal claim.

It is an object of the invention to achieve a system for the supply of power to an apparatus and a method of determining the lifetime and capacity of a power-storage device for the storage of electric power independently of the operating current.

This system should additionally be able to avoid a deep discharge of the power-storage device and the continual measuring of its currents. Furthermore it should be possible to determine the capacity and lifetime of a power-storage device during the charging or discharging processes. In addition the electrical measurement quantities used such as voltage and current should be mutually interchangeable, and the system should be usable for any type of power-storage device.

The invention achieves this objective by means of a second measuring device for the measurement of a second electrical quantity of the power-storage device, and a comparator to compare the second electrical quantity, relative to the determined time, with a stored typical time-characteristic of the second electrical quantity. This system makes it possible to reach a conclusion regarding the capacity and lifetime of the power-storage device independently of the power demands of the apparatus connected to it.

In an advantageous implementation of the system the typical time-characteristic of the second electrical quantity is the typical exhausted characteristic of an exhausted power-storage device and/or the typical new characteristic of the virgin curve of the power-storage device. This is a simple method of obtaining a meaningful reference characteristic for the assessments.

In an advantageous implementation the system also contains a switch unit to separate the power-storage device from the apparatus as soon as a minimal level of the first electrical measuring quantity has been measured, in order to protect the power-storage device from a more or less total discharge (deep discharge).

A further advantageous implementation of the system also contains an impedance-determining device to determine the impedance of the power-storage device. This makes possible the detection of short circuits, open circuits in cells and an increase in impedance due to ageing.

A further advantageous implementation of the system also contains a device to detect a short circuit in a cell and overcharging in the power-storage device. This makes it possible to detect developing short circuits in cells and any resulting overcharging of individual cells.

A further advantageous implementation of the system also contains a circuit breaker for the protection of the power-storage device from erroneous re-connection to the apparatus after the switching device has disconnected it from the apparatus. This ensures that the power-storage device remains disconnected after a malfunction or before deep discharge takes place and is not erroneously reconnected.

In a further advantageous implementation of the system the circuits for charging or discharging the power-storage device are constructed symmetrically in order to prevent the power-storage device from being asymmetrically charged or asymmetrically discharged.

In a further implementation of the system circuits connected to the power-storage device are preferably effected by means of field-effect transistor technology. This is especially advantageous in that leakage currents while the battery units are in storage are minimised and premature discharge thus counteracted.

The method invented for the assessment of the lifetime and capacity of a power-storage device comprises as its first step the measurement of a first electrical quantity of the power-storage device, as its second step the determination of the time taken for the first electrical quantity to reach a first level, as its third step the measurement of a second electrical quantity of the power-storage device, as its fourth step the comparison of the second electrical quantity relative to the determined time with a stored, typical time-characteristic of the second electrical quantity and as its fifth step the evaluation of the comparison carried out in the fourth step in order to assess the lifetime and capacity of the power-storage device.

The method described above of determining the lifetime and capacity of a power-storage device is independent of operating-current conditions, can be carried out during charging or discharging and can be applied to any type of power-storage device. Moreover the electrical measurement quantities used, such as voltage and current, are interchangeable.

In an advantageous implementation of the method the evaluation in the fifth step is based on the differential between the second electrical quantity and the stored typical time-characteristic of the second electrical quantity. This permits the drawing not only of qualitative (exhausted or not exhausted) but also quantitative conclusions about the anticipated lifetime of the power-storage device.

In a further advantageous implementation of the method the lifetime of the power-storage device is assessed only if the second electrical quantity does not exceed a maximum level. This is aimed at establishing a meaningful criterion for lifetime assessment, as substantially increased current or substantially increased voltage is often indicative of a fault in the system.

In another advantageous implementation of the method the second step is carried out only when the first electrical quantity has reached a second level. Careful selection of the second level affects the frequency with which lifetime assessments can be anticipated. It can also ensure that a minimum operational period must elapse.

In a further advantageous implementation of the method the power-storage device contains several individual power-storage devices and the first and second electrical quantities are determined from a single individual power-storage device. This also permits the ageing of part of the power-storage device to be detected if it is constructed of several individual power-storage devices. When ageing is detected only a part of the power-storage device needs replacement.

In an advantageous implementation of the system or method described above the first electrical quantity is a voltage and the second electrical quantity is a current. It is an advantage of the invention that electrical quantities such as current and voltage are interchangeable and can be selected according to the field of application.

The application of the systems or methods described above which is foreseen by the invention is in an interrupt-free power-supply system consisting of a first device for supplying power to the apparatus and a second device for supplying power to the apparatus, where under normal operating conditions the apparatus is powered by the first device and the second power-supply device takes over the supply of power to the apparatus when operating conditions change. The assessment of the capacity and lifetime of the power-storage device results in a power-supply system of high operational reliability, as ageing and capacity remaining can be recognised in good time and appropriate countermeasures taken such as replacing the power-storage device when it has significantly aged. This guarantees genuinely interrupt-free operation.

Figure 2:
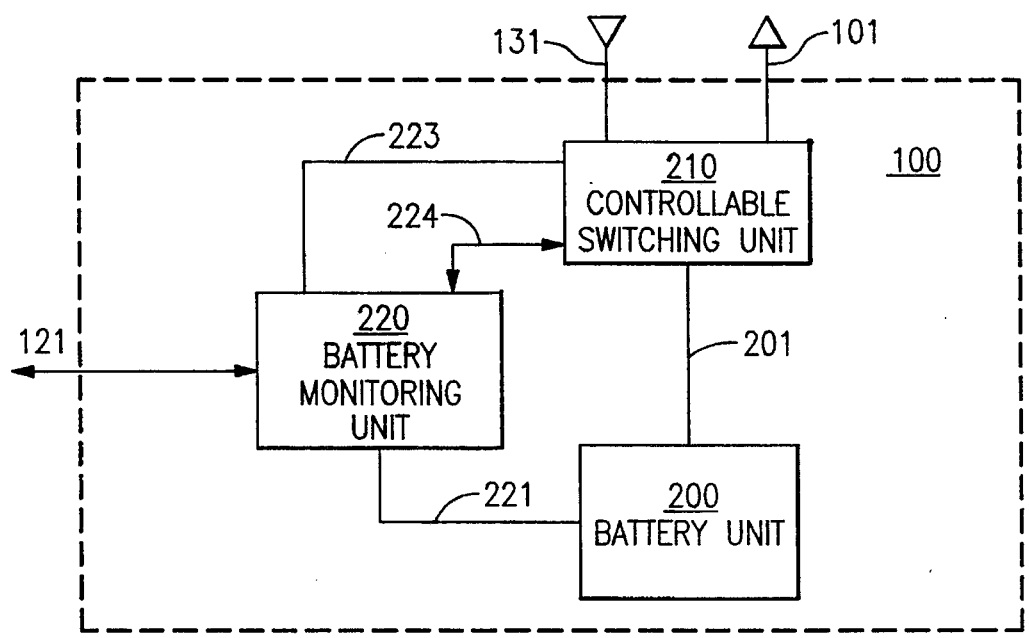
Figure 3:
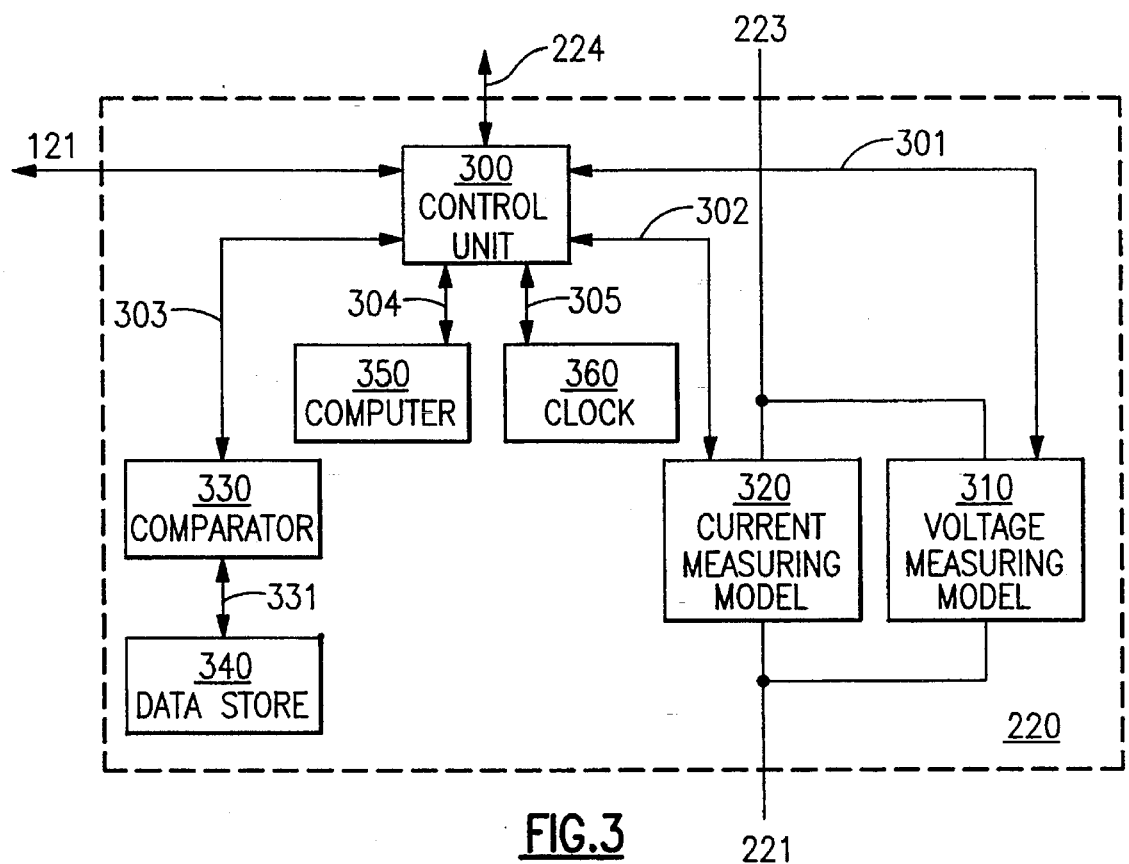
Figure 4:
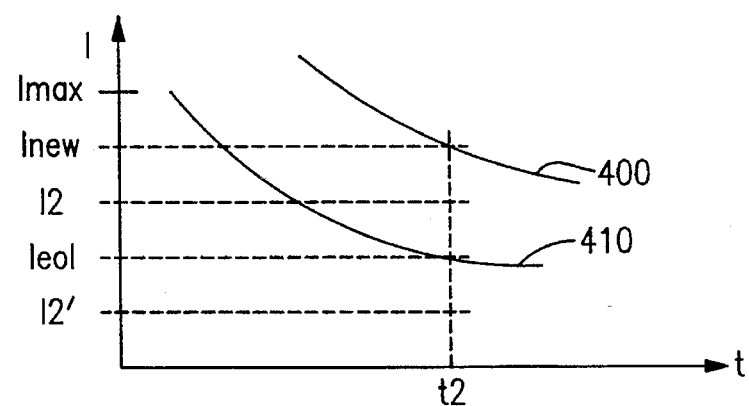
Figure 5:
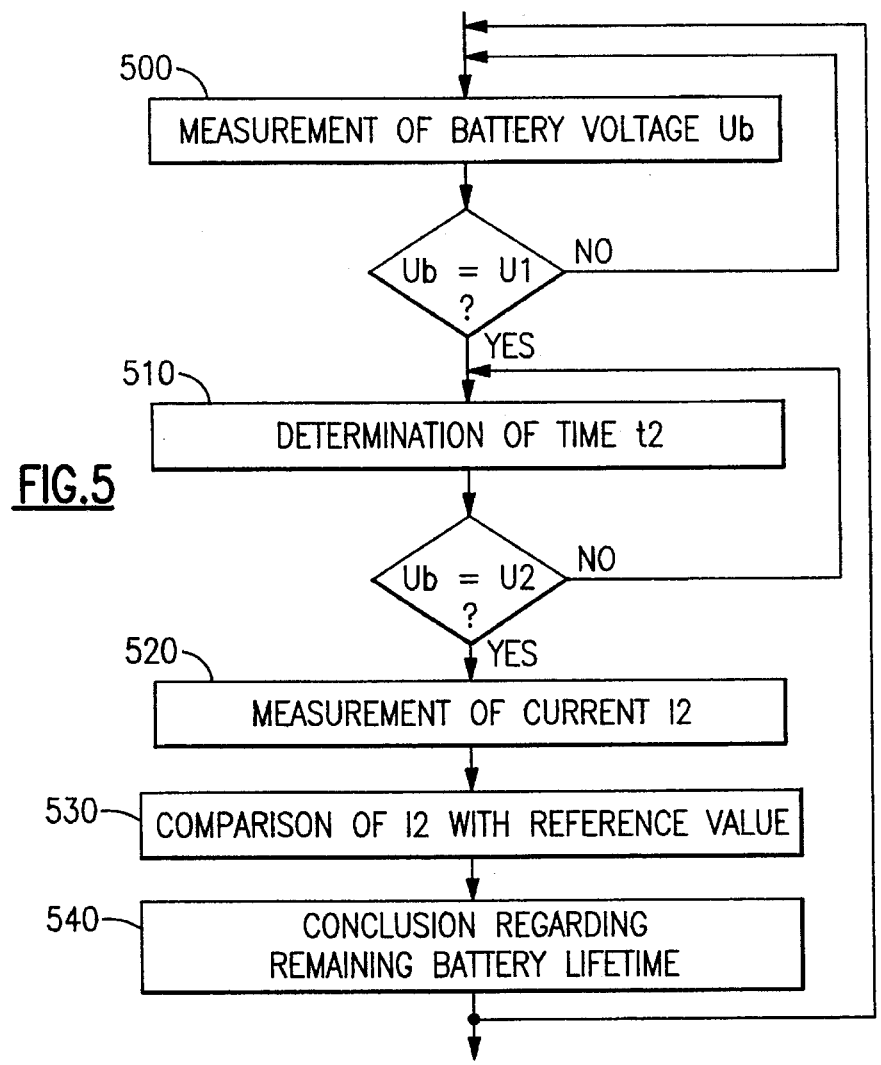
Figure 6:
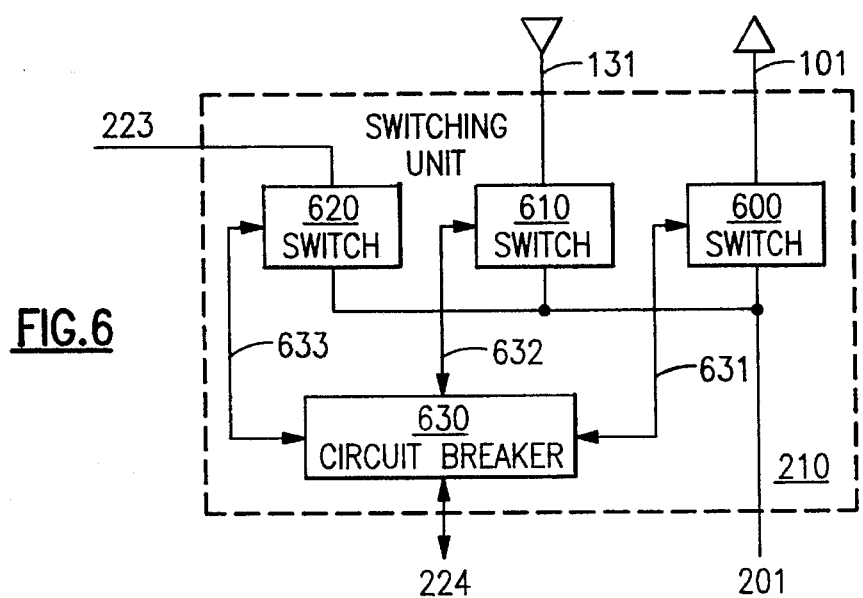

The following examples of implementation refer to the drawings for a clearer explanation of the invention. They show:

FIG. 1 an entire interrupt-free power-supply system, e.g. for a data-processing installation FIG. 2 the structure of a separate emergency supply unit FIG. 3 the structure of a battery-monitoring unit FIG. 4 a typical current-over-time battery-discharge diagram FIG. 5 in a block diagram the method of assessing the lifetime and capacity of batteries FIG. 6 the switching unit of one implementation with restart protection.

In the interrupt-free power-supply system shown in FIG. 1, e.g. for the operation of a data-processing installation, an AC/DC converter 110 connected to a DC-supply bus 140 converts the AC supply 107 at the input 105 of the AC/DC converter 110 to DC current at the DC supply bus 140. Several cards 170 and 175 are connected in parallel to this DC supply bus 140 and are powered by a common DC current. At the input of each of these cards 170 and 175 there is a further current converter 150 or 155 coupled between the DC supply bus and the relevant consumer 160 or 165. The current converters 150 or 155 convert the DC current from the DC supply bus 140 to the voltage required by the relevant consumer 160 or 165.

A charging unit 130 is connected at its input with an output of the AC/DC converter 110 or, in a different implementation, coupled directly to the AC current 107 at its input 105. The output of the charging unit 130 is connected to an emergency power unit 100 by link 131. The charging unit 130 supplies the emergency power unit 100 with charging power converted from the AC current 107 and appropriate to the charge state of the emergency power unit 100. In another implementation the emergency power unit 100 is not, or is only periodically, linked to the AC current 107 and is then supplied by it. The emergency power unit 100 is further coupled to the DC-supply bus 140 by link 101.

A power-supply-monitoring unit 120 couples to the AC/DC converter 110 by link 111 and to the emergency power unit 100 by link 121. In a preferred implementation example of the invention the DC supply bus 140 is supplied in normal operating conditions only by the AC/DC converter 110. If the power-supply-monitoring unit 120 detects irregularities in the AC current 105 or in the AC/DC converter 110 it switches the emergency power unit 100 to the DC supply bus 140 as a supplementary power unit.

FIG. 2 shows the structure of the emergency power unit 100. A battery unit 200 containing at least one battery is connected by link 201 to a controllable switching unit 210 and by link 221 to a battery-monitoring unit 220. Switching unit 210 is coupled by link 101 to the DC supply bus 140, by link 131 to the charging unit 130 and by links 223 and 224 to the battery-monitoring unit 220. The battery-monitoring unit 220 is further linked by link 121 with the power-supply-monitoring unit 120. The switching unit 210 controls the direction of the current to the link 201. as well as the switching of the emergency power unit 100 to the DC supply bus 140 and the switching of the charging unit 130 to the battery unit 200.

The operation of the battery-monitoring unit 220 is shown in FIG. 3. A control unit 300 is linked by link 224 with the switching unit 210 and by link 121 with the power-supply-monitoring unit 120. The control unit 300 is further coupled by link 301 with a voltage-measuring module 310, by link 302 with a current-measuring module 320, by link 303 with a comparator 330 and by link 305 with a clock 360. In a further implementation a computer 350 couples to the control unit 300 by link 304. The operation of the computer 350 will be further explained below. The comparator 330 is linked with a data store 340 by a connection 331. The voltage-measuring module 310 and current-measuring module 320 are each connected to links 221 and 223.

Under the control of the control unit 300 the battery-monitoring unit 220 measures the entire battery voltage of the battery unit 200 and that of each individual battery of the battery unit 200 with the voltage-measuring module 310 and determines the current in link 201 with the current-measuring module 320. To avoid a rapid discharge of the battery unit 200 the electrical links connected to it should preferably be equipped with field-effect transistor technology. This is of particular advantage in order to keep leakage currents from the battery unit 200 during storage to a minimum so as to counteract premature discharge. The battery monitoring unit 220 is further capable of determining the time by means of the clock 360.

The control unit 300 gathers the current and voltage data by means of the current-measuring module 320 and voltage-measuring module 310 and passes these by link 121 to the power-supply-monitoring unit 120 and by link 303 to the comparator 330 which compares the measured values with the data stored in the data store 340.

The procedure for assessing the remaining lifetime and capacity of the battery unit 200 is explained in FIG. 5. In a first step 500 the voltage-measuring module 310 determines the battery voltage Ub of the battery unit 200. The battery voltage Ub may be either the voltage of the entire battery unit or that of an individual battery forming part of battery unit 200.

When a particular battery voltage U1 is reached the control unit 300, in the next step 510, determines the time t2 taken for the battery voltage Ub to reach a second value U2. The value of U2 should be selected so that the electrical power in link 301 during time t2 remains more or less constant. When battery voltage U2 is reached the current-measuring module 320, controlled by the control unit 300, determines in a further step 520 the strength of the current I2 in link 201.

In the following step 530 the comparator 330 now compares the strength of the current I2 with a typical reference value of the battery current, stored in a data store 340, relative to time t2 and by comparing the two currents in step 540 draws a conclusion about the remaining lifetime and capacity of the battery unit 200 or about whether it should be replaced. The conclusion drawn may be purely qualitative (good/bad) or also quantitative, taking the form of an assessment of remaining lifetime and capacity.

FIG. 4 shows in diagrammatic form a typical current-over-time diagram of battery discharge as it might be stored in the data store 340. Characteristic curve 400 describes the typical virgin curve of a battery type while characteristic curve 410 depicts the discharge characteristic of an exhausted battery. If the measured current I2 at time t2 exceeds current Ieol as given by characteristic curve 410, the distance between I2 and Ieol or current Inew at time t2 of the new curve 400 permits an assessment of remaining battery lifetime to be made or a simple exhausted/not-exhausted conclusion to be drawn. If the value of I2' is beneath the characteristic curve 410 the battery monitoring unit 220 sends a signal to the power-supply-monitoring unit 120 by link 121 that the battery unit 200 should be replaced.

Just as the procedure described above permits an assessment of battery lifetime by measurements taken during discharge, equivalent assessments can be made by taking measurements during charging and comparing them with the typical charging characteristic of a battery. Here too the electrical quantities current and voltage can be interchanged, i.e. the time taken for the current in link 201 to change from a first to a second value is determined and an assessment of capacity or lifetime made by comparing the battery voltage determined when the second current value was reached with the typical time-characteristic of the voltage of this type of battery stored in the data store 340.

Furthermore the invention is applicable to any form of power-storage device for the storage of electric power. These may be batteries, accumulators, other forms of electro-chemical power-storage media and also capacitors.

A further implementation of the invention bases an assessment of the capacity and lifetime of the battery unit 200 on the criteria [sic] that the measured current-strength I2 must be smaller than a maximum current-strength Imax in order to be able to draw a meaningful conclusion about remaining lifetime and capacity. A further criterion for making a lifetime assessment might be that the battery unit 200 must be fully discharged or charged at the commencement of the charging or discharge process. This criterion too increases the authority of the lifetime assessment, since the initial conditions for measurements are always more or less the same.

In order to keep the load on the battery unit 200 to a minimum, in a further implementation the assessment of the capacity or lifetime of the battery unit 200 is carried out in such a way that the value of the first measurement quantity, the attainment of which begins the timing, is selected so that it will be reached only after a certain minimum operating period of the battery unit 200. This ensures that the test will be carried out only after a protracted period of battery operation.

In a further implementation of the invention the battery-monitoring unit 220 sends a signal to the power-supply-monitoring unit 120 by link 121 when a minimum voltage Umin (or a minimum current Imin) has been reached during the discharge process of the battery unit 220. The power-supply-monitoring unit 120 then sends a signal to e.g. the data-processing installation that the supply from the emergency power unit 100 will be disconnected from the DC-supply bus 140 by the switching unit 210 after a certain time tab of the order of minutes. If the voltage (or current) in link 201 reaches a second value Ucrit (or Icrit) before time tab has elapsed, the battery unit 200 is immediately disconnected from the DC-supply bus 140 by the switching unit 210 in order to forestall a deep discharge of the battery unit 200.

In a further implementation of the invention the battery monitoring unit 220 carries out an impedance test on the battery unit 200. In this the battery voltage and battery current of the battery unit 200 are determined simultaneously and used by the computer 350 to calculated battery impedance. Here too either the total voltage and total current of battery unit 200 can be determined or a partial voltage and current of a component part of battery unit 200.

The battery-monitoring unit 220 can detect ageing of the battery unit 200 from an increase in battery impedance. This is done by comparing the detected impedance values with reference values stored in the data store 340. The relative deviation from these reference values permits either a quantitative or a purely qualitative conclusion (old/not old) to be drawn. The reference values stored may be either ageing values typical of the battery type or impedance values from previous measurement cycles.

The battery-monitoring unit 220 can also detect a possible open link in the battery unit 200 by impedance measurement and report it to the power-supply-monitoring unit 120.

As a further implementation of the invention FIG. 6 shows a switching unit 210 which provides re-start protection. For this purpose the switching unit 210 contains a circuit breaker 630 linked to the battery-monitoring unit 220 by link 224. The three switches 600, 610 and 620 are all connected to battery unit 200 by link 201 and are coupled with the circuit breaker 630 by links 631, 632 and 633 respectively. Switch 600 is linked by a further connection by link 101 to the DC-supply bus 140, switch 610 by link 131 to the charging unit 130 and switch 620 by link 223 to the battery-monitoring unit 220.

The operation of the re-start protection is effected by the circuit breaker 630. This causes all signals reaching the circuit breaker 630 from the control unit by link 224 to be held internally within the circuit breaker 630 for longer than they are hanging in link 224. This prevents the battery unit 200 from being erroneously re-connected to the DC-supply bus 140 (e.g. by a spurious signal) after the battery-monitoring unit 220, e.g. after detecting a fault, has sent a signal for the battery unit 200 to be disconnected from the DC-supply bus 140 by the switching unit 210.

If the battery unit 200 contains more than one battery in series a further implementation of the invention has electronic links coupled to the series circuit of the batteries symmetrically arranged in order to prevent the individual batteries in the series circuit from being asymmetrically charged or discharged.

In a further implementation of the invention, in order to detect a possible short circuit in a cell or the overcharging of a battery in a series circuit of n identical batteries, the control unit 300 of the battery-monitoring unit 220 compares the nth part of the total measured voltage of the series circuit of the batteries with each measured individual battery voltage of the n batteries in series. If the control unit 300 detects a deviation in the nth part of the total voltage of the n individual battery voltages greater than a certain tolerance value it reports the fault to the power-supply-monitoring unit 120.

If when a deviation from the tolerance value is detected the individual voltage is greater than the nth part of the total voltage, it is possible that an individual battery has been overcharged. However, if the individual voltage is less than the nth part of the total voltage it may be that parts of the individual battery may be exhibiting a short circuit in a cell. Overcharging may be the result of a short circuit in a cell in another individual battery.

If not all the batteries in a series circuit of n batteries are of the same type and have differing nominal voltages this must be taken into account in the comparison as described above.

The invention claimed is:

1. An apparatus for assessing the lifetime and capacity of a power storage means for supplying power to a device, said apparatus comprising:

a first measuring means for measuring a first electrical quantity of the power storage means;

a time determining means for determining a time on reaching a first level of the first electrical quantity characterized by:

a second measuring means for measuring a second electrical quantity of the power storage means; and a comparator means for comparing the second electrical quantity relative to the determined time with a stored typical time characteristic of the second electrical quantity;

whereby the first electrical quantity either is a voltage or a current, the second electrical quantity then either being the current or the voltage respectively; and the measurements being applicable during a supply of the device by the power storage means.

2. The apparatus in accordance with claim 1 wherein the typical time-characteristic of the second electrical quantity is a typical exhausted characteristic of the exhausted power-storage device or a typical new characteristic of a virgin curve of the power-storage means.

3. The apparatus in accordance with claim 1, further comprising:

an impedance-determining means for the determination of the impedance of the power-storage means.

4. The apparatus in accordance with claim 1, further comprising:

a means for the detection of a short circuit in a cell and overcharging in the power-storage means.

5. The apparatus in accordance with claim 1 further comprising:

a power storage means for storing electrical energy.

6. The apparatus in accordance with claim 1, further comprising:

a switching unit for the disconnection of the power-storage means from the device when a minimum level of the first electrical quantity has been measured.

7. The apparatus in accordance with claim 6, further comprising:

a circuit breaker for the protection of the power-storage means from being erroneously reconnected to the device after the switching unit has disconnected the power-storage means from the device.

8. The apparatus in accordance with claim 1, further including:

circuits for charging or discharging of the power-storage means, said circuits being symmetrically arranged.

9. The apparatus in accordance with claim 8 in which said circuits for charging or discharging of the power-storage means are equipped with field-effect transistors.

10. A method for assessing the lifetime and capacity of a power storage means, for supplying power to a device, said method comprising the steps of:

a first step of measuring a first electrical quantity of the power storage means;

a second step of determining a time at which the first electrical quantity has reached a first level;

a third step of measuring a second electrical quantity of the power storage means;

a fourth step of comparing the second electrical quantity, relative to the determined time, with a stored typical time characteristics of the second electrical quantity; and a fifth step of evaluating the comparing of the fourth step for assessing the lifetime and capacity of the power storage means;

whereby the first electrical quantity either is a voltage or a current, the second electrical quantity then either being the current or the voltage respectively; and the measurements being applicable during a supply of the device by the power storage means.

11. The method in accordance with claim 10 wherein in the fifth step the evaluation is based on the relative difference between the second electrical quantity and the stored typical time-characteristic of the second electrical quantity.

12. The method in accordance with claim 10 wherein the lifetime of the power storage means is assessed only if the second electrical quantity does not exceed a maximum level.

13. The method in accordance with claim 10 wherein the second step is carried out only when the first electrical quantity has reached a second level.

14. The method in accordance with claim 10 wherein the power-storage means comprises several individual power-storage means, and the first and second electrical quantities are determined for one individual power-storage means of the several power-storage means.

15. The method of claim 10 wherein a first power-supply system supplies power to the device, and a second power-supply system also supplies power to the device, the apparatus is powered by the first system and the second power-supply system takes over the supply of power to the device when operating conditions change.

* * * * *